United States Patent [19]
Keller

[11] Patent Number: 5,955,954
[45] Date of Patent: Sep. 21, 1999

[54] WARNING AND MEASURING DEVICE FOR PERSONAL PROTECTION IN ELECTROMAGNETIC FIELDS

[75] Inventor: Helmut Keller, Pfullingen, Germany

[73] Assignee: Wandel & Goltermann Management Holding GmbH, Germany

[21] Appl. No.: 09/094,783

[22] Filed: Jun. 15, 1998

[30] Foreign Application Priority Data

Jun. 19, 1997 [DE] Germany .................... 197 26 138

[51] Int. Cl.⁶ .................................................. G08B 17/12
[52] U.S. Cl. ........................ 340/600; 340/573.1; 324/258; 324/260
[58] Field of Search .......................... 340/600, 573.1, 340/693.5, 693.6; 324/258, 260

[56] References Cited

U.S. PATENT DOCUMENTS

| | | | |
|---|---|---|---|
| 2,365,592 | 12/1944 | Reason | 33/501.6 |
| 4,292,590 | 9/1981 | Wilson | 324/226 |
| 5,168,265 | 12/1992 | Aslan | 340/600 |
| 5,363,045 | 11/1994 | Martin et al. | 324/395 |
| 5,373,285 | 12/1994 | Aslan | 340/600 |
| 5,532,681 | 7/1996 | Peters et al. | 340/573 |
| 5,576,696 | 11/1996 | Adler | 340/600 |
| 5,773,974 | 6/1998 | Kraz | 324/258 |

FOREIGN PATENT DOCUMENTS

| | | |
|---|---|---|
| 2402975 | 8/1974 | Germany . |
| 9107364 | 11/1991 | Germany . |
| 2244560 | 12/1991 | United Kingdom . |
| WO8501358 | 3/1985 | WIPO . |

Primary Examiner—Jeffery A. Hofsass
Assistant Examiner—Ashok Mannava
Attorney, Agent, or Firm—Bachman & LaPointe, P.C.

[57] ABSTRACT

A warning and measuring device for personal protection with a rod-shaped casing shape. The shape of the casing allows the device to be suitable 1. for measuring if held in the hand or mounted on a tripod, 2. for warning when carried on the body and 3. for leak detection in hollow conductors. This is made possible through a compact construction and a movable absorber which in an absorber package within a cap can be fitted to the casing while the cap is detachable and can be used as handle on the other end. The device can be economically manufactured and with regard to quality can be considered a high-quality measuring instrument.

18 Claims, 1 Drawing Sheet

WARNING AND MEASURING DEVICE FOR PERSONAL PROTECTION IN ELECTROMAGNETIC FIELDS

BACKGROUND OF THE INVENTION

The invention concerns a warning and measuring device for personal protection in electromagnetic fields with a casing to accommodate sensors for the electric field (E-field sensor) and the magnetic field (H-field sensor), evaluation electronics with electric power supply and a display feature.

Such display devices are known from U.S. Pat Nos. 5,168,265 and 5,373,285. These devices have a casing in which are arranged a sensor for electromagnetic radiation, a conductive shield arranged at a distance from the sensor and absorption material arranged in between. Via the thickness the absorption material becomes increasingly more conductive in the direction of the conductive shield. This measuring instrument is a warning device which can be carried by people.

These instruments are not generally used for measuring electromagnetic fields. For this purpose separate and especially larger and more sophisticated devices are available on the market.

The object of the present invention is to propose a warning and measuring device of the type described at the outset which can be carried on the body as a compact device and be used as both alarm device and also as hand-held measuring instrument.

SUMMARY OF THE INVENTION

According to the invention this task is solved by a warning and measuring device of the present invention.

According to this the warning and measuring device as per the invention has a casing with a laterally detachable cap into which an absorber is integrated such that it shields at least the E-field sensor on one side of the instrument. The sensors employed are sensors whose sensitivity is independent of the angle of incidence and the polarization of the field to be measured (isotropic sensors). In addition the sensors are of a frequency-dependent sensitivity which corresponds to the inverse course of the respective limit value curve. Otherwise the sensors would have to be aligned with every measurement so as to supply maximum basic values. The alignment would have to be carried out separately for both sensors. By way of the detachable cap with absorber it is possible to use the device both on the body as a warning device and as a hand-held measuring instrument. The absorber is arranged between the body and the sensors in order to prevent that the sensors are influenced by the body. If the instrument is not carried on the body but held in the hand as a measuring instrument or mounted on a tripod, the absorber can be removed so that its proximity does not lead to a deterioration of the isotropy of the sensors.

BRIEF DESCRIPTION OF THE DRAWINGS

In the following, the invention is explained in more detail with an example of an embodiment with the accompanying drawings, wherein.

DETAILED DESCRIPTION OF PREFERRED EMBODIMENTS

Figure 1:
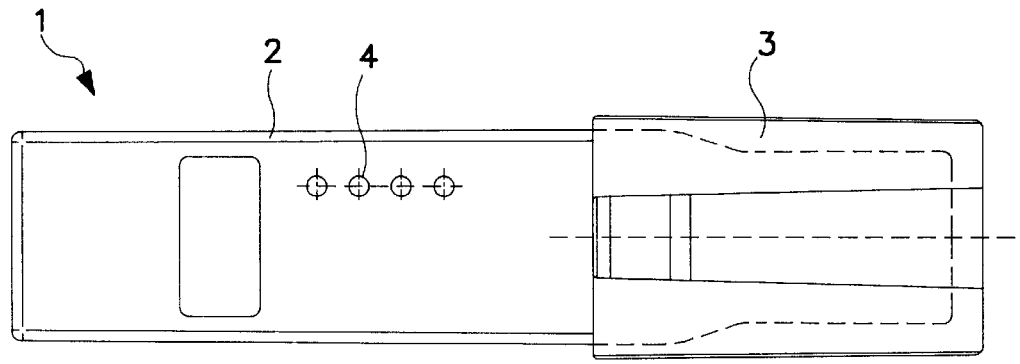
FIG. 1 is the top view of a warning and measuring device.

In order to evaluate the exposure of people to electromagnetic fields it is possible according to popular guidelines such as VDE 0848 to utilize the electric and magnetic field intensity. In this it must be observed that the field intensity values have to be determined without the presence of a person. If the limit values are not exceeded a person may be present in the investigated area after the measurement. The permissible limit values for the electric and magnetic field intensity are dependent on frequency. If the measuring instrument is carried on the body in order to be used as a warning device, this contravenes the guidelines. However, if it is also possible in this case to indicate the field intensity which would prevail if the person were not present, such an application too would comply with the guidelines. Consequently no influencing of the sensors through the body must result either. At low frequencies (<several 100 MHz) this cannot be achieved. At high frequencies an HF absorber between body and probe can suppress the influencing effect. Investigations have shown that with low frequencies with a body resonance of around 70 MHz a field increase of approximately 14 dB takes place on the body. This means the exposure is overvalued. For the remainder it can be said that in the frequency between 1 MHz and several 100 MHz at least one of the field components is at least as great as if the body were not present. However, this applies only if the sensors are not located at a side of the body facing away from the radiation source. On the side facing away an undervaluation resulting from shadowing must be expected. Subject to these limitations the warning device designed according to the invention can be carried on the body and provide the respective information. Although the measuring accuracy is not very high, it is nevertheless possible to largely exclude an undervaluation of the exposure, with the exception of shadowing effects, if both isotropic H-field sensors and E-field sensors are used. Since the frequency range of the H-field sensors is limited at the top to approximately 1 MHz for technical reasons but the effect of an absorber is limited to frequencies above several hundred MHz, it is primarily preferable to shield the E-field sensor by means of an absorber so that at least the E-field component is correctly indicated.

In order to allow the handling of the instrument on the one hand and the arrangement of the sensors and the evaluation electronics at adequate distances on the other hand the casing is longitudinally (rod-shaped) constructed and the E-field sensor is located at one end of the casing. The cap can preferably be fitted to both ends of the casing. On the one hand this serves to shield the E-field sensor against body influences when the device is carried on the body as mentioned above. On the other hand the cap cannot be lost when the absorber has to be removed when the device is used as a measuring instrument. In addition this has the advantage that the casing is extended by arranging the cap on the end opposite the E-field sensor. In order to also permit the search for leaks in hollow conductors the casing width tapers at the end accommodating the E-field sensor in order to allow access to narrow openings. By fitting the cap to the end opposite the E-field sensor the cap can also be used as a handle. This is particularly practical if the device is used as a hand-held measuring instrument. Because of the compact construction of the device the display elements of the evaluation electronics such as light-emitting diodes can be easily obscured by the hand without an additional handle. An advantage of using the cap as additional handle is that the sensors are further removed from the hand resulting in a higher measuring accuracy. According to a further embodiment of the invention a tripod closure in the cap permits the attachment of the device to a tripod and consequently best possible measuring accuracy due to an even greater distance away from the body and closer approaching of the measuring point.

According to a further preferred embodiment of the invention the casing has a thinner cross section in the area of the E-field sensor than in the remaining area so that when fitting the cap with integrated absorber the outer edge of the absorber is largely in alignment with the rest of the casing and the cap is held on this side in the area of the casing having a larger cross section. In this way it is possible to arrange the absorber between body and E-field sensor if required without increasing the entire thickness of the arrangement.

In order to achieve an adequate absorption effect through the absorber a first absorber layer according to a further embodiment of the invention is constructed as resonance absorber and a second broad-band absorber layer is provided in the direction of the sensor. The second layer is required since the resonance absorber assumes reflective properties by way of its resonant frequency. According to a further embodiment an electrically conductive layer is provided on the side facing the body in order to achieve a certain independence from the distance to the body.

The field sensors must not influence each other and must also not be influenced by any other parts of the measuring instrument. For this reason and according to a further preferred embodiment the evaluation electronics are arranged in a chamber provided in the casing end opposite the E-field sensor and shielded against electromagnetic fields. The chamber can be shielded for instance by means of metallic vapor coating or other measures deemed appropriate by the expert.

In order to design the inner construction of the casing with regard to shielding as compact and optimal as possible the sensors are arranged on a sensor board in a second chamber which is connected with the evaluation electronics by means of an electric connection line. According to a further embodiment the evaluation electronics are arranged on a board projecting from the first chamber through an internal separating wall and which board is equipped with through-connection metallic surfaces for connection with the shield on both sides in the area of the opening in the separating wall of the first chamber. The metallic surfaces preferably also have contact with the wall for potential compensation between the earth of the board and the earth of the casing.

In a further practical embodiment the casing has an upper part and a lower part connected through a groove and tongue joint. In order to shield the first chamber an elastic HF sealing cord is provided furthermore between the upper part and the lower part in the adjoining walls of this chamber in order to ensure a conductive connection between the shield in the upper and lower parts. In order to additionally prevent a hole in the shield, the board projects from the first chamber between upper and lower parts.

Audible and optical signal devices are provided in the casing. Light-emitting diodes are preferably provided as optical signal devices which are calibrated in steps of 3 dB. This allows rough measurement. If a higher resolution is required the device is able to output the data also through a bi-directional, serial and optical interface which can be accomplished in the type and manner familiar to an expert. In this context it is important that it is an optical and not an electrical interface since a conductive cable in the vicinity of the measuring instrument would drastically reduce the measuring accuracy. Through this interface it is also possible to separately output the data of the E and H-field probes simultaneously which is very helpful for specific measuring problems. The LED display shows only the larger value of E- and H-fields which is adequate in order to establish the exposure according to the standard.

The warning and measuring device constructed according to the invention therefore constitutes a device which is suitable for three applications: 1. Measuring, when it is held in the hand or mounted on a tripod, 2. Warning, when it is carried on the body and 3, Leak detection. Despite all this the device can be economically produced and with regard to quality it is situated in the range of high-quality measuring instruments which is achieved by the special shape of the casing permitting the three applications, the movable absorber and the economical but nevertheless highly effective spatially selective shielding technology.

Figure 2:
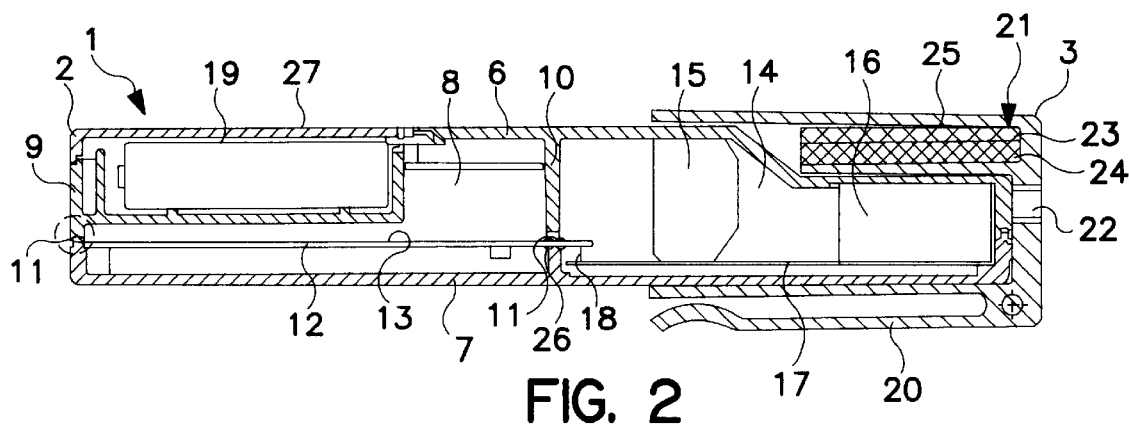
FIG. 2 is a longitudinal section through the device according to FIG. 1.
Figure 3:
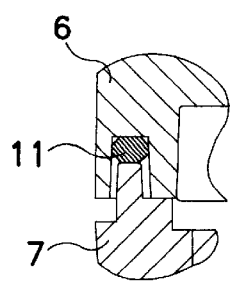
FIG. 3 is an enlarged representation of the connection between upper and lower part in the area of the shielded chamber.

FIG. 1 shows the warning and measuring device 1 with the longish casing 2 onto which a cap 3 is fitted at one end. The casing and the cap are made of a material which is neutral with regard to electromagnetic fields, e.g. plastic with a dielectric number <3. 4 light-emitting diodes 4 are located on the upper side of the casing 2. In addition a loudspeaker not shown is provided in the casing 2 as audible signal device. As shown in FIG. 1 the casing 2 in the area of the cap 3 is tapered in order to be able with this part of the casing to better reach cavities when searching for leaks in hollow conductors. A more detailed construction is visible from the representation of the longitudinal cross section of the casing 2 and the cap 3 in FIG. 2. According to this the casing 2 consists of a lower part 6 and an upper part 7 joined with a groove and tongue joint shown in enlarged form in FIG. 3. The casing 3 has a shielded chamber 8 at its left end shown in the figure which on the inside is vapor-coated with an electrically conductive layer. Both the outer wall 9 and the inner wall 10 of the chamber 8 have an HF sealing cord 11 (FIG. 3) in the area of the slot and tongue joint. This elastic and conductive sealing cord results in a sound contact between the two casing parts. The evaluation electronics, symbolically termed 13, are located on a board 12 (printed circuit board) in the shielded chamber which can be easily mounted as a result of the separation of the casing 2 in a lower part 6 and an upper part 7. As shown in the figure the board 12 projects from the shielded chamber 8 somewhat into the adjoining chamber 14 in which are located the isotropic H-field sensor 15 and the isotropic E-field sensor 16 on a sensor board 17 at the extreme end of the casing 2. The sensor board 17 is connected with the evaluation electronics 13 by way of an electrical connection 18. This type of connection permits simple and economical assembly. Furthermore, a hole in the shield is prevented in that the board 12 is mounted at the level of the slot and tongue joint. In the area of the inner wall 10 the board has metallic surfaces 26 on both sides which are connected by the respective inner wall 10 on the lower part 6 and the upper part 7 at least on one side through the elastic HF sealing cord 11. Both metallic surfaces on the board 12 are connected with through-connections in order to allow the formation of only very small gaps in the shield even in the interior of the board 12. The metallic surfaces on the board 12 also ensure sound potential compensation between the earth of the board 12 and the earth of the casing 2. A battery compartment 19 for the electric power supply with detachable lid 27 is also located in the vicinity of the shielded chamber 8.

The cap 3 arranged at the tapered end of the casing 2 is provided with a clip 20 for clipping the device to a piece of clothing. Furthermore, an absorber 21 is integrated in the cap 3 which shields the E-field sensor 16 in the tapered area. This embodiment keeps the entire thickness of the device over the length of the casing largely constant without being too bulky. This thickness amounts to approximately 2.5 cm and the casing width is also around this dimension. The maximum length is approximately 16 cm.

The cap 3 is held on the casing in transverse ribs in the type and manner familiar to the expert so that inadvertent detachment of the cap 3 from the casing 2 is not possible. Should the device 1 be used as measuring instrument or as leak detection device, the cap 3 with the absorber 21 must be removed. So as to avoid losing it and additionally improve the handling of the device 1 it can be fitted to the opposite end of the casing 2. It is then held on the casing 2 in the corresponding type and manner then serving as extension and handle. An appropriate tripod can be screwed into the opening 22 in the cap 3 in order to be able to cover with the device 1 areas further away or to exclude the influence of the human body on the measuring accuracy during measurement. The absorber 21 is an absorber consisting of a first absorber layer 23 of an absorber C-RAM-FLX 2 manufactured by Cuming Corporation, Mass., U.S.A. and a broad-band second absorber layer 24 towards the probes. In this case a foam absorber for instance made of C-RAM-MT series of the above mentioned company is suitable. The first absorber layer has an absorption resonance of around 2 GHz and still has a considerable absorption effect even at several 100 MHz. The absorber is approximately 3 mm thick. On the side facing the body the absorber is provided with an electrically conductive foil 25 in order to obtain a certain independence of the distance to the body.

I claim:

1. Warning and measuring device for personal protection in electromagnetic fields, which comprises: a casing; sensors in the casing for an electric field (E-field sensor) and a magnetic field (H-field sensor) evaluation electronics; electrical power supply for said sensors; and a display device; a cap on one end of the casing in which an absorber is integrated in such a way that it shields at least the E-field sensor at the side facing the body to permit said device to be worn on the body as a mobile warning device; wherein the cap is detachable from the casing for use as measuring instrument.

2. A device according to claim 1, wherein the casing has two ends and the casing is of elongated construction and the E-field sensor is arranged at one end of the casing.

3. A device according to claim 2, wherein the cap is operative to be fitted to the casing at both ends of the casing.

4. A device according to claim 2, wherein the casing is tapered in width at the end accommodating the E-field sensor.

5. A device according to claim 1, wherein the casing is of a thinner cross section in the area of the E-field sensor than in the remaining area so that when fitting said cap with said integrated absorber an outer edge of the absorber is largely aligned with the rest of the casing and the cap is held on this side in the area of the casing having a larger cross section.

6. A device according to claim 1, wherein the cap is provided with an opening at an end thereof for attachment of a tripod.

7. A device according to claim 1, wherein the cap on the side opposite the absorber is provided with a clip to clip the cap to a piece of clothing.

8. A device according to claim 1, wherein the absorber has a first absorber layer constructed as a resonance absorber and in the direction of the E-field sensor a second broad band absorber layer.

9. A device according to claim 8, wherein the absorber is provided with an electrically conductive layer on the side facing the body.

10. A device according to claim 1, wherein a chamber accommodating the evaluation electronics is arranged in the casing.

11. A device according to claim 10, wherein said chamber is arranged at the end opposite the E-field sensor which shields against electromagnetic fields.

12. A device according to claim 10, wherein the sensors are located on a sensor board arranged in a second chamber of said casing which is connected with the evaluation electronics by way of an electric connection line.

13. A device according to claim 12, wherein the evaluation electronics are arranged on a board projecting from the first chamber through an inner separating wall which in the area of the opening in the separating wall of the first chamber has through-connected metallic surfaces on both sides for the connection with the shield.

14. A device according to claim 13, wherein the metallic surfaces are also in direct contact with the wall for potential compensation between the surface of the board and the surface of the casing.

15. A device according to claim 1, wherein the casing has an upper part and a lower part interconnected by means of a slot and tongue joint.

16. A device according to claim 10, wherein for shielding in the first chamber the end walls of this chamber have an elastic HF sealing cord between an upper part of the casing and a lower part of the casing in order to ensure a conductive connection between the shield in the upper part and the lower part.

17. A device according to claim 13, wherein said board projects between an upper part of the casing and a lower part of the casing from the first chamber.

18. A device according to claim 1, wherein light-emitting diodes are provided as optical signal devices.

* * * * *